United States Patent
Kopysov et al.

(10) Patent No.: US 9,548,763 B2
(45) Date of Patent: Jan. 17, 2017

(54) DATA ENCODING METHOD AND ELECTRONIC DEVICE THEREFOR

(71) Applicant: Samsung Electronics Co., Ltd., Suwon-si, Gyeonggi-do (KR)

(72) Inventors: Oleg Kopysov, Kharkiv (UA); Mykola Raievskyi, Cherkassy (UA); Oleksandr Kanievskyi, Kyiv (UA); Roman Hush, Ochtyrka (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 14/591,391

(22) Filed: Jan. 7, 2015

(65) Prior Publication Data

US 2015/0194986 A1    Jul. 9, 2015

(30) Foreign Application Priority Data

Jan. 9, 2014 (KR) .......................... 10-2014-0002847

(51) Int. Cl.
*H03M 13/03* (2006.01)
*H03M 13/00* (2006.01)
(Continued)

(52) U.S. Cl.
CPC ......... *H03M 13/616* (2013.01); *H03M 13/036* (2013.01); *H03M 13/1515* (2013.01); *H03M 13/373* (2013.01)

(58) Field of Classification Search
CPC ............ H03M 13/616; H03M 13/1515; H03M 13/036; H03M 13/373
See application file for complete search history.

(56) References Cited

U.S. PATENT DOCUMENTS 8,621,317 B1 * 12/2013 Cypher ............. H03M 13/2909 714/755

2006/0075321 A1    4/2006  Vedantham et al.
(Continued)

OTHER PUBLICATIONS

Plank J S et al, Optimizing Cauchy Reed-Solomon Codes for Fault-Tolerant Network Storage Applications, Proc. 5th IEEE International Symposium on Network Computing and Applications 2006, Cambridge, MA, USA, Jul. 24-26, 2006, Piscataway, NJ, USA, IEEE, pp. 173-180, XP010934172, DOI: 10.1109/NCA.2006.43, ISBN: 978-0-7695-2640-9.

(Continued)

*Primary Examiner* — Sam Rizk
(74) *Attorney, Agent, or Firm* — Jefferson IP Law, LLP

(57) ABSTRACT

A method and electronic device for encoding data are provided. The method includes acquiring sets $x_j$ (j=1 ... k) and $y_i$ (i=1 ... p) in generating a Generator Cauchy Matrix, wherein k denotes a number of information symbols, and p denotes a number of parity symbols, generating a matrix A1 using the sets $x_j$ and $y_i$, wherein elements of the matrix A1 are obtained by $$\frac{1}{x_j + y_i}$$

and have weight of Galois field, and the matrix A1 has a size of P×K, generating a set K, wherein all elements of the set K are not included in the sets $x_j$ and $y_i$, updating the set $x_j$ by changing at least one element of the set $x_j$ for an element of the set K, updating the set $y_i$ by changing at least one element of the set $y_i$ for the set K element, generating the Generator Cauchy Matrix using the updated sets $x_j$ and $y_i$, and encoding data including the information symbols and parity symbols using the Generator Cauchy Matrix.

14 Claims, 9 Drawing Sheets

(51) Int. Cl.
*H03M 13/15* (2006.01)
*H03M 13/37* (2006.01)

(56) References Cited

U.S. PATENT DOCUMENTS

| | | |
|---|---|---|
| 2006/0077890 A1 | 4/2006 | Suryavanshi et al. |
| 2006/0212782 A1 | 9/2006 | Li |
| 2006/0280254 A1 | 12/2006 | Luby et al. |
| 2012/0210190 A1 | 8/2012 | Luby et al. |
| 2015/0128008 A1* | 5/2015 | Chatradhi ........... G06F 11/1076 714/766 |

OTHER PUBLICATIONS

Yin Chao et al, Robot: An efficient model for big data storage systems based on erasure coding, 2013 IEEE International Conference on Big Data, IEEE, Oct. 6, 2013, pp. 163-168, XP032535142, DOI: 10.1109/BIGDATA.2013.6691569.

Xiangxue Li et al, Toward optimizing cauchy matrix for cauchy reed-solomon code, IEEE Communications Letters, IEEE Service Center, Piscataway, NJ, US, Aug. 1, 2009, vol. 13, No. 8, pp. 603-605, XP011271927, ISSN: 1089-7798, DOI: 10.1109/LC0MM.2009.090988.

* cited by examiner

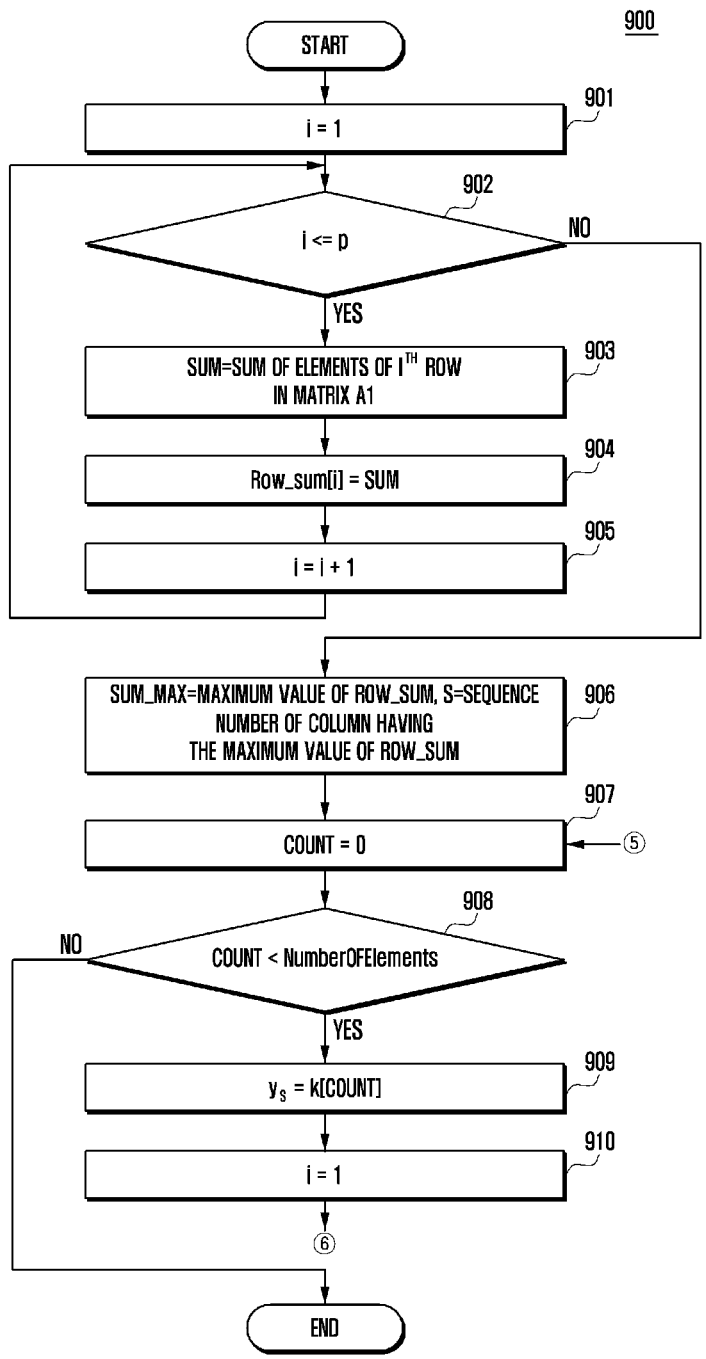

DATA ENCODING METHOD AND ELECTRONIC DEVICE THEREFOR

CROSS-REFERENCE TO RELATED APPLICATION(S)

This application claims the benefit under 35 U.S.C. §119 (a) of a Korean patent application filed on Jan. 9, 2014 in the Korean Intellectual Property Office and assigned Serial number 10-2014-0002847, the entire disclosure of which is hereby incorporated by reference.

TECHNICAL FIELD

The present disclosure relates to a broadcast/communication system. More particularly, the present disclosure relates to a method and electronic device for encoding data.

BACKGROUND

In recent fiber optic communication, broadcasting, and digital data communication environments, data congestion becomes more severe on a network due to electromagnetic interference, a poor signal reception condition, traffic load, etc. This makes it difficult for a signal transmitted by a sender to reach a receiver correctly, and thus causes data loss. Such data loss causes user inconvenience in various forms, like video and audio quality degradation, pixelization, a missing subtitle, file damage, satellite-based location information error, and data rate drop-off.

There is therefore a need of a technology for recovering the data loss on the network. Forward Error Correction (FEC) is a powerful technique capable of correcting, as well as detecting the occurrence of data error on the network. The FEC enhances data reliability in such a way that the sender transmits redundant information along with the data in order for the receiver to detect and correct errors using this information. That is, when data loss is detected at the receiver, the receiver performs decoding the data using the redundant data included therein.

One of the widely used FEC codes for a FEC coding device is Reed-Solomon code. Although there are various Reed-Solomon algorithms, technologies, and methods, it is difficult to apply them to embedded devices, such as smartphone and tablet computer, especially in a high speed data communication environment for the following reasons.

The use of a lookup table for mathematical operation may slow the encoding and decoding speeds. Complex operations, such as a determination for generating a reverse matrix of the generator matrix, vector multiplication, and element addition increase data decoding time. Also, a block matrix structure decreases the data processing speed and increases the complexity of the decoding process.

The above problems slow down the implementation speed of the Reed-Solomon algorithm. This makes it difficult to use the Reed-Solomon algorithm in the high speed data communication environment.

There is therefore a need of a data encoding method based on a Generator Cauchy Matrix that is capable of encoding data in the high speed data communication environment.

The above information is presented as background information only to assist with an understanding of the present disclosure. No determination has been made, and no assertion is made, as to whether any of the above might be applicable as prior art with regard to the present disclosure.

SUMMARY

A complex and efficient operation may slow data encoding and decoding speeds and thus are inappropriate for data recovery in a high speed data communication environment. Aspects of the present disclosure are to address at least the above-mentioned problems and/or disadvantages and to provide at least the advantages described below. Accordingly, an aspect of the present disclosure is to provide a data encoding method and apparatus for encoding data efficiently in the high speed data communication environment.

In accordance with an aspect of the present disclosure, a data encoding method is provided. The data encoding method includes acquiring sets $x_j$ (j=1 ... k) and $y_i$ (i=1 ... p) in consideration of a rule of generating a Generator Cauchy Matrix, wherein k denotes a number of information symbols, and p denotes a number of parity symbols, generating a matrix A1 using the sets $x_j$ and $y_i$, wherein elements of the matrix A1 are obtained by $$\frac{1}{x_j + y_i}$$

and have weight of a Galois field, and wherein the matrix A1 has a size of P×K, generating a set K, wherein all elements of the set K are not included in the sets $x_j$ and $y_i$, updating the set $x_j$ by changing at least one element of the set $x_j$ for an element of the set K, updating the set $y_i$ by changing at least one element of the set $y_i$ for the element of the set K, generating the Generator Cauchy Matrix using the updated sets $x_j$ and $y_i$, and encoding data including the information symbols and parity symbols using the Generator Cauchy Matrix.

In accordance with another aspect of the present disclosure, an electronic device is provided. The electronic device includes a memory configured to store a Cauchy Reed-Solomon module configured to perform the processes of acquiring sets $x_j$ (j=1 ... k) and $y_i$ (i=1 ... p) in consideration of a rule of generating a Generator Cauchy Matrix, wherein k denotes a number of information symbols, and p denotes a number of parity symbols, generating a matrix A1 using the sets $x_j$ and $y_i$, wherein elements of the matrix A1 are obtained by $$\frac{1}{x_j + y_i}$$

and have weight of a Galois field, and wherein the matrix A1 has a size of P×K, generate a set K, wherein all elements of the set K are not included in the sets $x_j$ and $y_i$, update the set $x_j$ by changing at least one element of the set $x_j$ for an element of the set K, update the set $y_i$ by changing at least one element of the set $y_i$ for the element of the set K, generate the Generator Cauchy Matrix using the updated sets $x_j$ and $y_i$, and encode data including the information symbols and parity symbols using the Generator Cauchy Matrix, a processor configured to execute the Cauchy Reed-Solomon module, and a radio communication unit configured to transmit the encoded data.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 6A and 6B are flowcharts illustrating details of operation 900 of FIG. 3 according to an embodiment of the present disclosure.

Throughout the drawings, it should be noted that like reference numbers are used to depict the same or similar elements, features, and structures.

DETAILED DESCRIPTION

Figure 1:
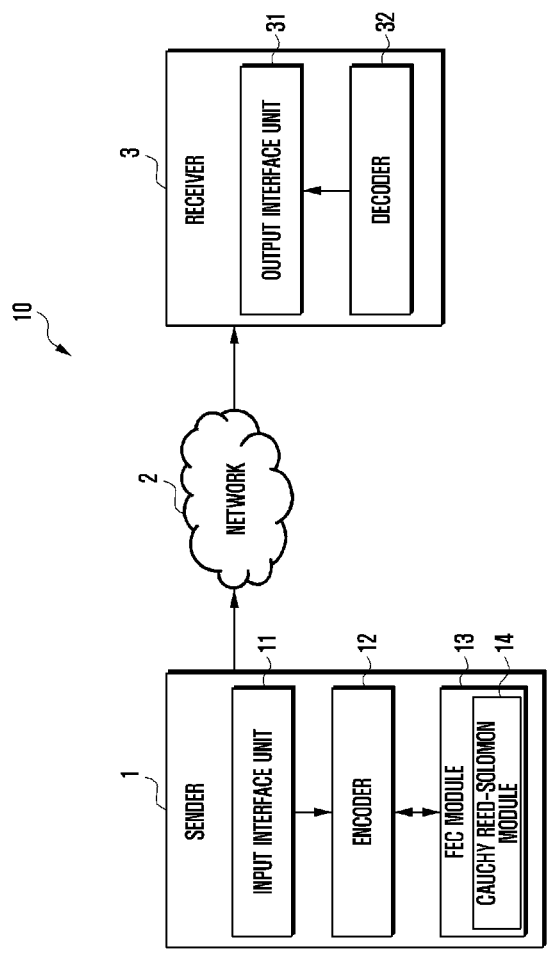
FIG. 1 is a schematic diagram illustrating a data communication system including a Forward Error Correction (FEC) module according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the drawings, certain elements may be exaggerated or omitted or schematically depicted for clarity of the present disclosure, and the actual sizes of the elements are not reflected. Thus, the present disclosure is not limited in the relative sizes of the elements and distances therebetween.

The various embodiments of the present disclosure can be applied to all the types of electronic devices (such as mobile phones, televisions (TVs), computers, tablets, and ebook readers) that are capable of supporting multimedia services such as video conference and video telephony as well as high quality high volume contents.

The terms frequently used in the present disclosure are defined as follows.

In the following description, the term 'symbol' denotes a data unit, and 'packet' is a data transmission unit.

FIG. 1 is a schematic diagram illustrating a data communication system including a Forward Error Correction (FEC) module according to an embodiment of the present disclosure.

Referring to FIG. 1, a data communication system 10 includes a sender 1, a network 2, and a receiver 3.

Each of the sender 1 and the receiver 3 may be a personal computer, a mobile computer, a mobile phone, a smart phone, or any other similar and/or suitable electronic device configured to perform communication using a network, such as the network 2. Data transmitted between the sender 1, the network 2 and the receiver 3 may be audio data, video data, any other similar and/or suitable type of data, and/or a combination thereof. The sender 1 sends the data to the receiver 3 through the network 2, and the sender 1 includes an input interface 11 for receiving data to be transmitted, an encoder 12, and an FEC module 13. The input interface 11 may include at least one of a touch panel, a microphone, a sensor unit, a camera, and a Global Positioning System (GPS) receiver. The data entered through the input interface 11 is transferred to the encoder 12 so as to be packetized. The packetized data is processed into a data packet supplemented through a Cauchy Reed-Solomon module 14 of the FEC module 13. The data packet generated by the FEC module 13 is transmitted to the receiver 3 through the network 2.

The receiver 3 receives the data transmitted by the sender 1 through the network 2 and includes an output interface 31 for displaying the received data and a decoder 32. The decoder 32 converts the received data packet to the original data format and transfer the converted data to the output interface 31. The output interface 31 may include at least one of a monitor, a panel, and a speaker. The output interface 31 outputs the data received from the decoder 32.

Figure 2:
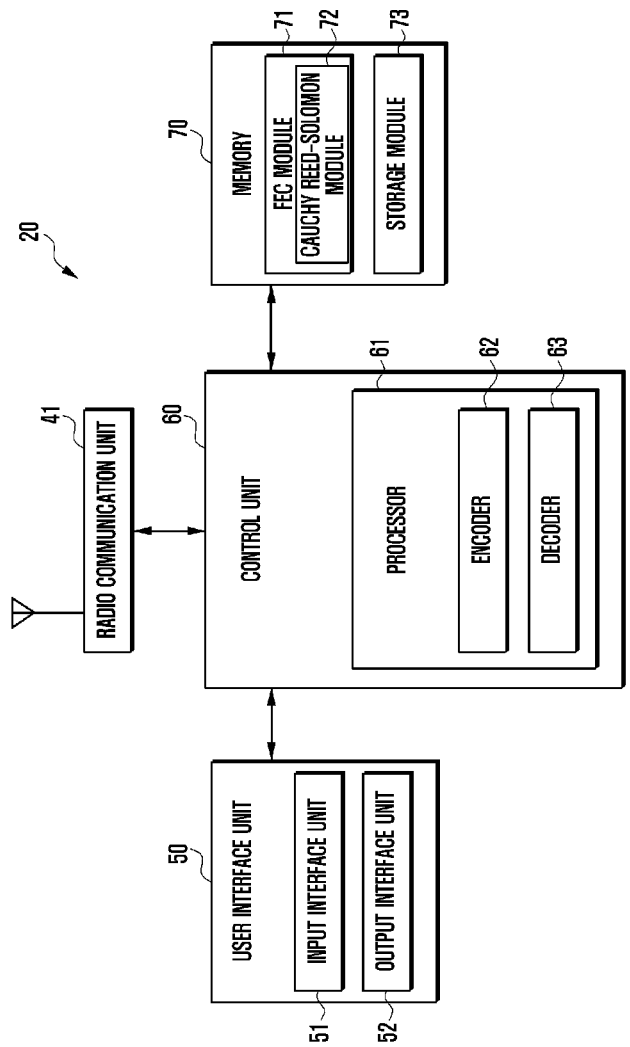
FIG. 2 is a block diagram illustrating a configuration of an encoding apparatus of an electronic device according to an embodiment of the present disclosure.

FIG. 2 is a block diagram illustrating a configuration of an encoding apparatus of an electronic device according to an embodiment of the present disclosure.

Referring to FIG. 2, an electronic device 20 includes a radio communication unit 41, a user interface unit 50, a control unit 60, and a memory 70. The radio communication unit 41 is responsible for voice communication, video communication, and data communication with another device through the network 2 under the control of the control unit 60. The data may be any of an email, an electronic document, a webpage, an audio file, a video file, user data, or any other similar and/or suitable data that may be transmitted through the network 2. The radio communication unit 41 may include at least one of a cellular communication module, e.g., a $3^{rd}$ Generation (3G) cellular communication module, a 3.5G cellular communication module, and 4th Generation (4G) cellular communication module, a digital broadcast module, e.g., digital multimedia broadcasting (DMB) module, a short range communication module, e.g., a wireless fidelity (Wi-Fi) module and a Bluetooth module, and a near field communication (NFC) module.

The user interface unit 50 is responsible for interacting with the user and includes an input interface unit 51 for receiving a user input and an output interface 52 for providing visual, auditory, and haptic feedback in response to the user input. The input interface unit 51 generates input data to an encoder 62 included in a processor 61 of the control unit 60. The output interface unit 52 outputs the data processed by a decoder 63 included in the processor 61 of the control unit 60.

The processor 61 includes the encoder 62 for packetizing the data and the decoder 63 for decoding the packetized data to original data. The encoder 62 converts the data input through the input interface unit 51 of the user interface unit 50 to packets. The data packets may carry large data so as to be encoded by a device capable of identifying information and in order to operate as wrappers. The wrappers may help safe arrival of the data packet to the destination address. The data packets are transmitted by the radio communication unit 41, and the transmitted data packet may be sent to the output interface unit 520 via the decoder 63. The decoder 63 decodes the data packets into the original data. For example, in the case of video data format, the video data is packetized by the encoder 62 of the control unit 60 and then transmitted by the radio communication unit 41. The packetized data may be decoded into the original video data by the decoder 63.

The memory 70 includes an FEC module 71 and a storage module 73. The FEC module 71 includes a Cauchy Reed-Solomon module 72. The FEC module 71 may be implemented in the form of an algorithm capable of recovering data lost in the data transmission environment. It may be impossible for the decoder 630 of the control unit 60 to recover the original data with damaged packets and/or lost packets. The FEC module 71 replaces the lost packets with corresponding redundant packets so as to recover the original data. The Cauchy Reed-Solomon module 72 of the FEC module may include an algorithm capable of simplifying the lost data recovery operation. The algorithm of the Cauchy Reed-Solomon module 72 is capable of increasing the encoding speed. The encoder 62 of the control unit 60 may use the algorithm of the Cauchy Reed-Solomon module 72 stored in the FEC module 71 of the memory 70 to encode data. The operation of the Cauchy Reed-Solomon module 72 is further described in the description with reference to FIGS. 3, 4A, 4B, 5A, 5B, 6A, and 6B.

The memory 70 may include a buffer (not shown) as a temporal data storage space. The memory 70 may store information for use in configuring a use environment of the electronic device 20. The control unit 60 is capable of controlling operation of the electronic device 20 using the information stored in the memory 70. The storage module 73 may be implemented with Random Access Memory (RAM) to store data generated inside the electronic device and received from an external device through the radio communication unit 41.

Figure 3:
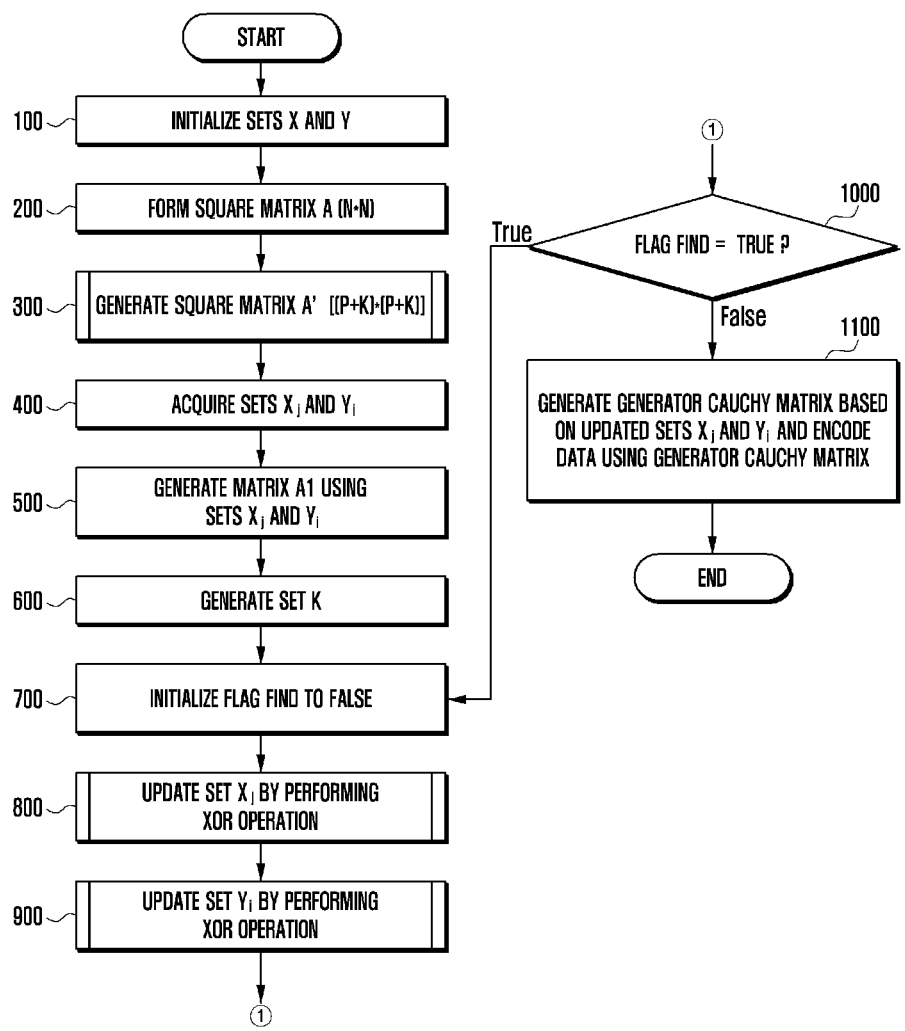
FIG. 3 is a flowchart illustrating an encoding procedure of an encoding apparatus of an electronic device according to an embodiment of the present disclosure.

FIG. 3 is a flowchart illustrating an encoding procedure of an encoding apparatus of an electronic device according to an embodiment of the present disclosure.

Prior to an explanation with reference to the flowchart of FIG. 3, a description is made of a Generator Cauchy Matrix. The Generator Cauchy matrix may be used to improve the encoding speed and is formed only with elements of Galois fields $GF[2^m]$. The elements of the Galois fields can be converted to an m×m matrix. For example, $GF[2^1]$ may be formed with 1s and 0s. The number of is in the matrix representation of the elements of $GF[2^m]$ is called a weight of the element.

In order to increase the speeds of the encoder and the decoder, a Generator Cauchy Matrix having the minimal weight may be used. The legacy Generator Cauchy Matrix is enumerative, and thus neither optimal nor efficient. The Cauchy matrix can be expressed as follows:

Matrix 1

$$GM = \begin{bmatrix} 1 & 0 & \cdots & 0 & 0 \\ 0 & 1 & \cdots & 0 & 0 \\ \cdots & \cdots & \cdots & \cdots & \cdots \\ 0 & 0 & \cdots & 1 & 0 \\ 0 & 0 & \cdots & 0 & 1 \\ \frac{1}{x_0+y_0} & \frac{1}{x_0+y_1} & \cdots & \frac{1}{x_0+y_{k-2}} & \frac{1}{x_0+y_{k-1}} \\ \frac{1}{x_1+y_0} & \frac{1}{x_1+y_1} & \cdots & \frac{1}{x_1+y_{k-2}} & \frac{1}{x_1+y_{k-1}} \\ \cdots & \cdots & \cdots & \cdots & \cdots \\ \frac{1}{x_{n-k-2}+y_0} & \frac{1}{x_{n-k-2}+y_1} & \cdots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \cdots & \frac{1}{x_{n-k-1}+y_{k-2}} & \frac{1}{x_{n-k-1}+y_{k-1}} \end{bmatrix}$$

$\forall i \in \{0, \ldots, n-k-1\}$, $\forall j \in \{0, \ldots, k-1\} : x_i + y_j \neq 0$;

$\forall i,j \in \{0, \ldots, n-k-1\}, i \neq j : x_i \neq x_j$;

$\forall i,j \in \{0, \ldots, k-1\}, i \neq j : y_i + y_j$.

Therefore, it is possible to derive a Generator Cauchy Matrix having a minimal weight.

Equation 1

$$C = \begin{bmatrix} \frac{1}{x_0+y_0} & \frac{1}{x_0+y_1} & \cdots & \frac{1}{x_0+y_{k-2}} & \frac{1}{x_0+y_{k-1}} \\ \frac{1}{x_1+y_0} & \frac{1}{x_1+y_1} & \cdots & \frac{1}{x_1+y_{k-2}} & \frac{1}{x_1+y_{k-1}} \\ \cdots & \cdots & \cdots & \cdots & \cdots \\ \frac{1}{x_{n-k-2}+y_0} & \frac{1}{x_{n-k-2}+y_1} & \cdots & \frac{1}{x_{n-k-2}+y_{k-2}} & \frac{1}{x_{n-k-2}+y_{k-1}} \\ \frac{1}{x_{n-k-1}+y_0} & \frac{1}{x_{n-k-1}+y_1} & \cdots & \frac{1}{x_{n-k-1}+y_{k-2}} & \frac{1}{x_{n-k-1}+y_{k-1}} \end{bmatrix} \quad (1)$$

The main object of the Generator Cauchy Matrix optimization is to find sets $x_j$ and $y_i$. The sets $x_j$ and $y_i$ may be generated from the Generator Cauchy Matrix having the minimal weight.

Referring to FIG. 3, the flowchart shows the procedure of finding the sets $x_j$ and $y_i$ to generate the Cauchy Matrix minimizing the number of 1s, i.e. having the minimal weight, as described above. A description is made of this procedure with reference to the flowchart of FIG. 3.

The control unit 60 performs operations described below using the algorithm of the Cauchy Reed-Solomon module 72 which is stored in the memory 70.

The control unit 60 receives the data entered through the input interface unit 51, and the control unit 60 initializes the sets $x_j$ and $y_i$ in operation 100 to acquire the Generator Cauchy Matrix using an information symbol sequence k and a parity symbol sequence p of the input data and Equation 1.

The control unit 60 may generate an n×n square matrix, which may be referred to as square matrix A, having a finite value n greater than (p+k), at operation 200. The square matrix A consists of $$\frac{1}{x_j + y_i}$$

elements at the $i^{th}$ row and $j^{th}$ column. The cross section of the $i^{th}$ row and $j^{th}$ column is filled with 0 according to a rule of obtaining the elements of the matrix.

The control unit 60 calculates a sum of the elements of each row of the square matrix A and deletes the row having the greatest sum until a number of rows becomes equal to p+k at operation 300 in order to generate a square matrix A'. The control unit 60 also may calculate a sum of elements of each column of the square matrix A and may delete a column having the greatest sum until the number of columns becomes equal to p+k. Through this process, the control unit 60 generates the square matrix A' of which numbers rows and columns are p+k. The detailed description of operation 300 is made later with reference to FIGS. 4A and 4B.

The control unit 60 obtains the element $x_j$, $y_i$ (i=1 ... p, j=1 ... k), which is capable of minimizing the Generator Cauchy matrix through combination of the sets $x_j$ and $y_i$, or in other words, acquires the sets $x_j$ and $y_i$, at operation 400.

The control unit 60 generates a matrix A1 using the sets $x_j$ and $y_i$ at operation 500. The elements of the matrix A1 may be of the Galois fields GF[$2^m$]. Each element is calculated by $$\frac{1}{x_i + y_j}.$$

The matrix A1 may be regenerated with size [p×k].

The control unit 60 generates a set K for the matrix A1 at operation 600. The set K may consist of all the elements with the exception of the elements of the sets $x_j$ and $y_i$.

The control unit 60 initializes a flag FIND to 'false', i.e., sets FIND=false, at operation 700. The flag may indicate a progress direction or an end of the operation process of the algorithm.

The control unit 60 updates the set $x_j$ through an XOR operation at operation 800. The control unit 60 also updates the set $y_i$ through an XOR operation at operation 900. The detailed description of operation 800 is made later with reference to FIGS. 5A and 5B. Also, the detailed description of operation 900 is made later with reference to FIGS. 6A and 6B.

The control unit 60 determines whether the flag FIND is set to true at operation 1000. If the flag FIND is set to true, the procedure returns to operation 700 to initialize the flag FIND to false. Otherwise if the flag FIND is set to false at operation 1000, then the procedure goes to operation 1100.

At operation 1100, the control unit 60 generates a Generator Cauchy Matrix based on the updated sets $x_j$ and $y_i$ and encodes the data entered through the input interface using the Generator Cauchy Matrix.

Figure 4A:
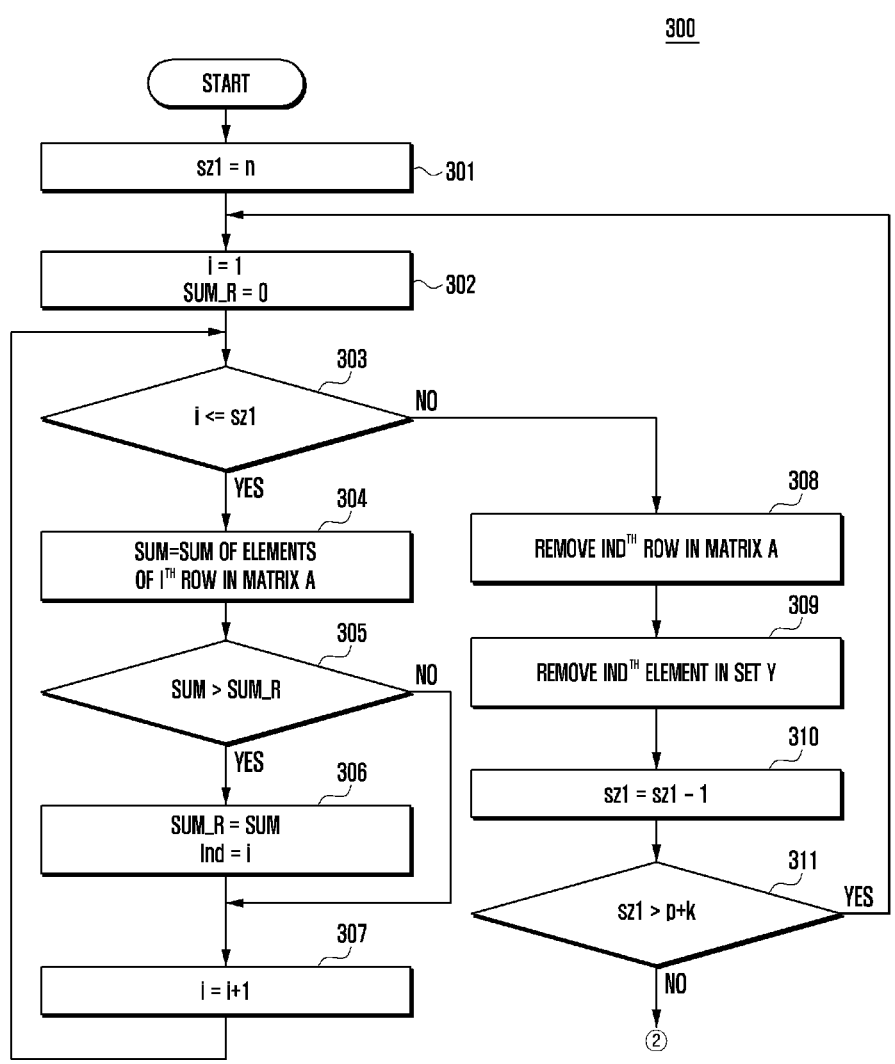
FIGS. 4A and 4B are flowcharts illustrating details of operation 300 of FIG. 3 according to an embodiment of the present disclosure.
Figure 4B:
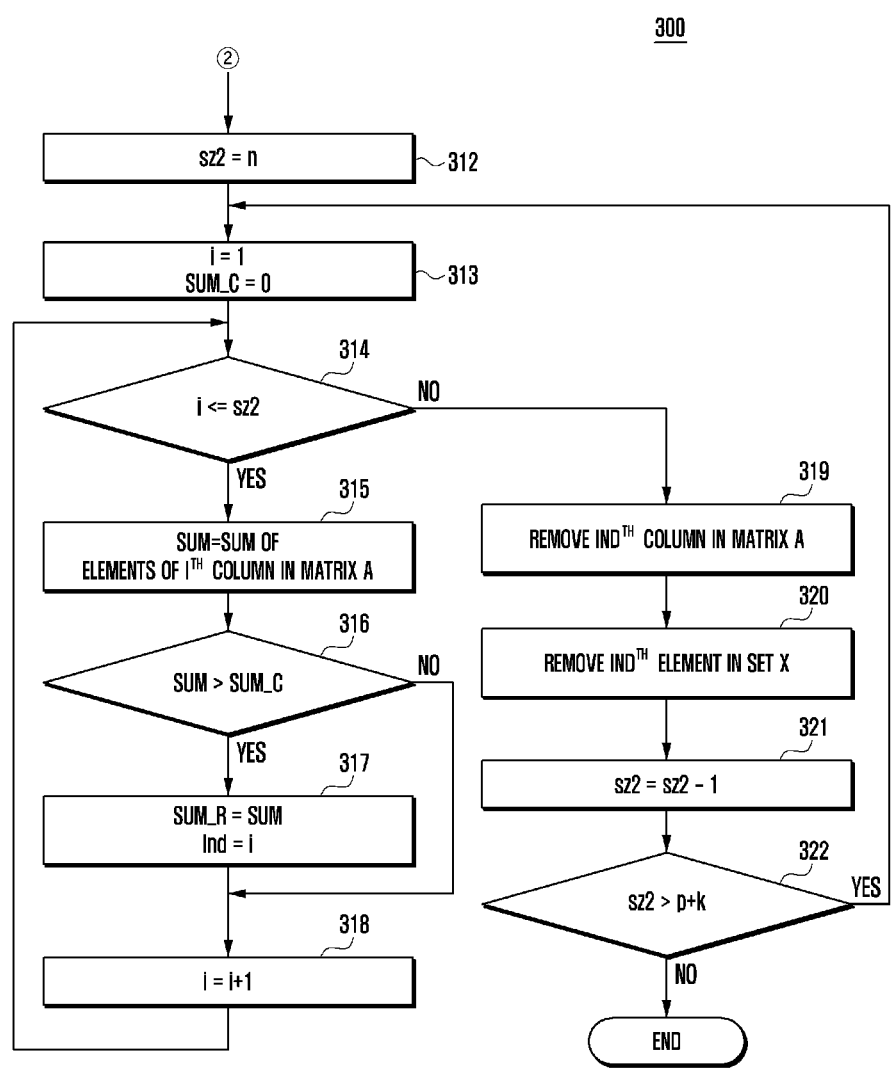

FIGS. 4A and 4B are flowcharts illustrating details of operation 300 of FIG. 3 according to an embodiment of the present disclosure.

Referring to FIG. 4A, the control unit 60 performs operations per row independently to generate the square matrix A' of operation 300 of FIG. 3. The control unit 60 sets the sz1 to be a random finite value n indicating the size of the matrix A, that is sz1=n, at operation 301. The control unit 60 initializes a counter i, for comparison with the size of the n rows, to be 1, that is i=1, and initializes a variable, SUM_R, indicating a sum of the elements of the row, to 0, that is SUM_R=0, at operation 302.

At operation 303, the control unit 60 compares the values sz1 and i, which were set at operations 301 and 302. If the counter value i is equal to or less than sz1, the control unit 60 calculates a sum of the elements of the $i^{th}$ column to designate a variable SUM at operation 304.

At operation 305, the control unit 60 compares the SUM, which was designated at operation 304, and the SUM_R, which was initialized to 0 at operation 302.

If the SUM is determined to be greater than SUM_R at operation 305, the control unit 60 sets the SUM_R to SUM, that is SUM_R=SUM, and a variable Ind to the counter value I, that is Ind=i, at operation 306. Otherwise, if the SUM is determined to be equal to or less than SUM_R, the procedure goes to operation 307 by skipping operation 306.

The control unit 60 increments i by 1 at operation 307, that is i=i+1 at operation 307, and then repeats operations 303 to 307.

If the counter value i is greater than sz1 at operation 303, the control unit 60 removes the $i^{th}$ row corresponding to the Ind set to i from the matrix A at operation 308.

The control unit 60 removes the element corresponding to Ind from the set Y at operation 309.

The control unit 60 decrements sz1 by 1, that is sz1=sz1−1, at operation 310.

The control unit 60 compares the sum of p and k with sz1 at operation 311 and, if the sum of p and k is less than sz1 returns the procedure to operation 302 to repeat the process until the sum of p and k becomes greater than sz1. If the sum of p and k is equal to or greater than sz1 at operation 311, the control unit 60 ends the row operation.

Referring to FIG. 4B, the control unit 60 performs the operation per column independently to generate the matrix A' of operation 300. The control unit 60 sets a variable sz2 to the random finite value n indicating the size of the matrix A, that is sz2=n, at operation 312.

Next, the control unit 60 initializes a counter i for comparison with the size of the n rows to 1, that is i=1, and a variable SUM_C for obtaining the sum of the elements of the row to 0, that is SUM_C=0, at operation 313.

At operation 314, the control unit 60 compares the values sz2 and i, which are respectively set at operations 312 and 313. If the counter value i is determined to be equal to or less than sz2, the control unit 60 calculates a sum of the elements of the $i^{th}$ column to designate a variable SUM at operation 315.

At operation 316, the control unit 60 compares the SUM, indicating the sum of the column elements and which is acquired at operation 315, with the SUM_C initialized to 0 at operation 313.

If the SUM is determined to be greater than the SUM_C at operation 316, the control unit 60 sets the SUM_C to the SUM, that is SUM_C=SUM, and a variable Ind to the counter value I, that is Ind=i, at operation 317. Otherwise if the SUM is equal to or less than SUM_C at operation 316, the procedure goes to operation 318 by skipping operation 317.

The control unit 60 increments i by 1, that is i=i+1, at operation 318 and then repeats operations 314 to 318.

If the counter value i is greater than sz2 at operation 314, the control unit 60 removes the $i^{th}$ row corresponding to the Ind set to i from the matrix A at operation 319.

The control unit 60 removes the element corresponding to the Ind from the set X at operation 320.

The control unit 60 decrements sz2 by 1, that is sz2=sz2−1, at operation 321.

The control unit 60 compares the sum of p and k with sz2 at operation 322 and, if the sum of p and k is less than sz2, returns the procedure to operation 313 to repeat the process until the sum of p and k becomes greater than sz2. If the sum of p and k is equal to or greater than sz2 at operation 322, the control unit 60 ends the column operation.

Figure 5A:
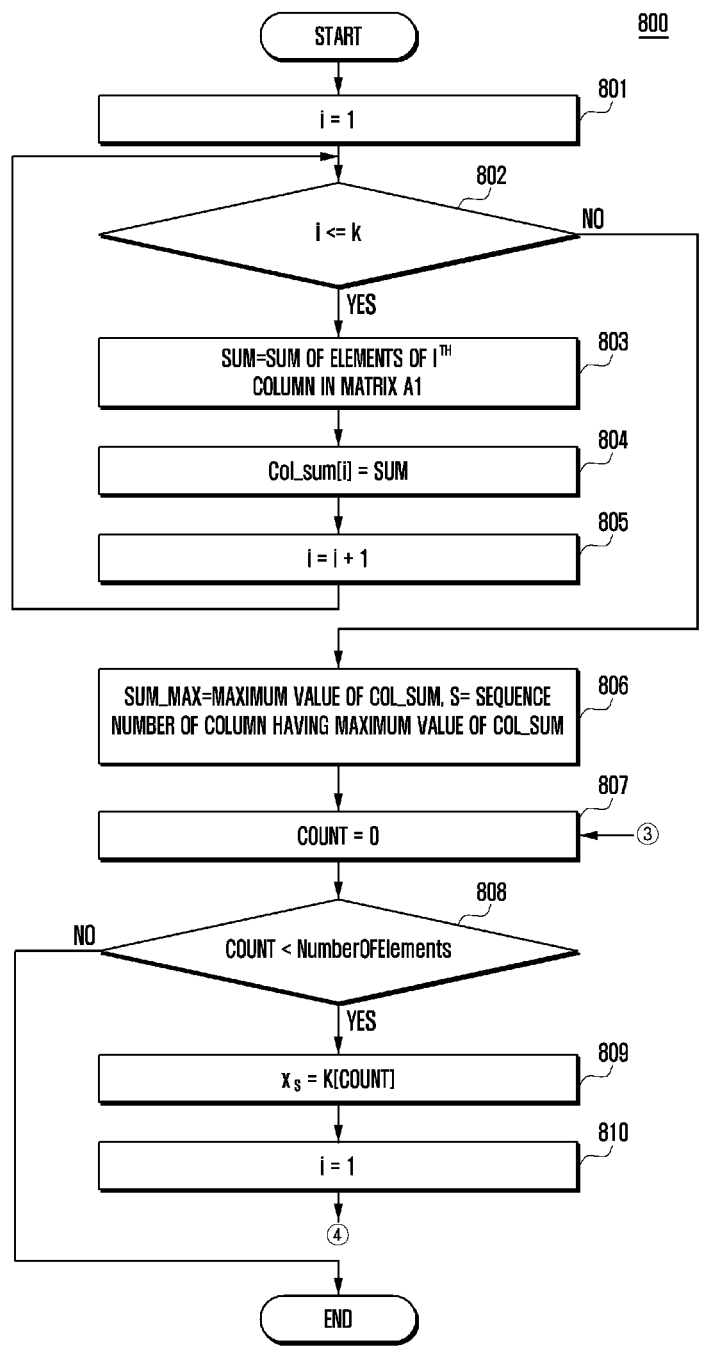
FIGS. 5A and 5B are flowcharts illustrating details of operation 800 of FIG. 3 according to an embodiment of the present disclosure.
Figure 5B:
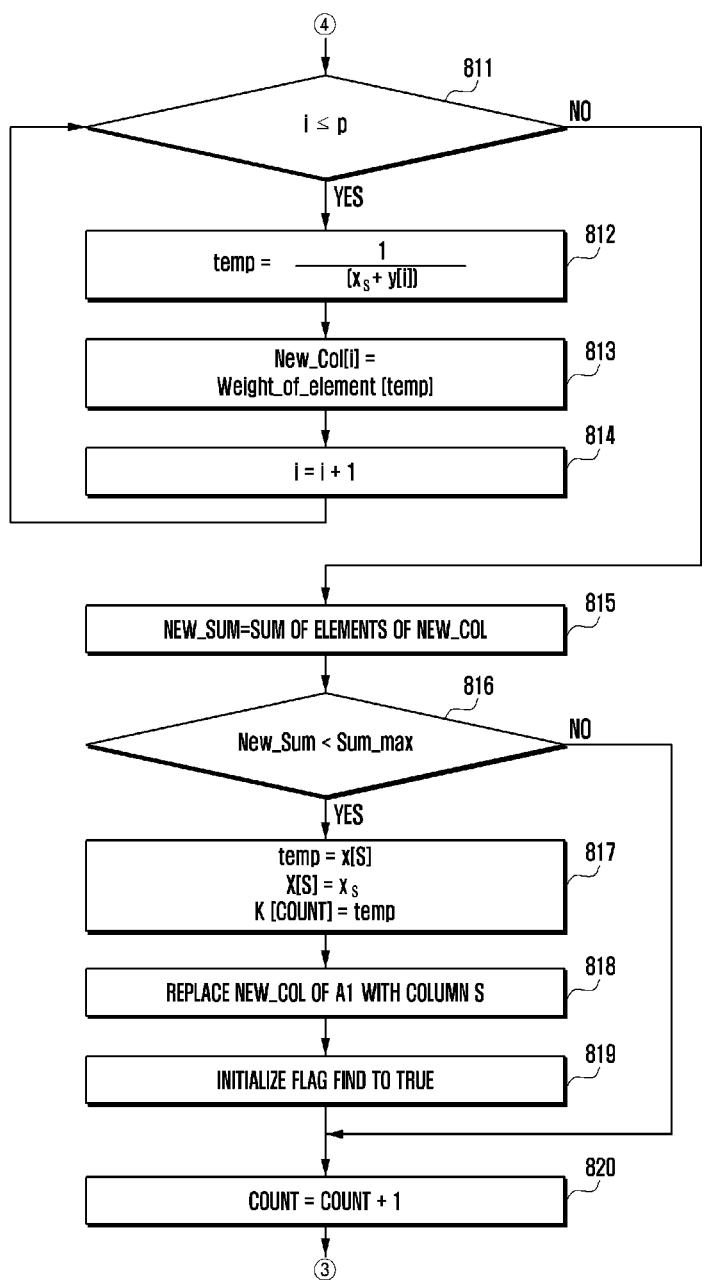

FIGS. 5A and 5B are flowcharts illustrating details of operation 800 of FIG. 3 according to an embodiment of the present disclosure.

Referring to FIG. 5A, the control unit 60 compares a largest value among the per-column sums of the matrix A1 with a sum of the elements of a set New_Col made up of values of $$\frac{1}{x_S + y[i]}$$

at operation 800 of FIG. 3, or in other words updates the set $x_j$ through an XOR operation. Through this process, the control unit 60 generates a column S of the matrix. The control unit 60 initializes a counter i, indicating the $i^{th}$ column, to 1, that is i=1, at operation 801. If the counter i is determined equal to or less than an information symbol sequence k, indicating a size of the matrix, in operation 802, then the procedure goes to operation 803.

At operation 803, the control unit 60 calculates a sum of the elements of the $i^{th}$ column of the matrix A1 obtained at operation 600 of FIG. 3, and sets a variable SUM to the sum of the elements of the $i^{th}$ column of the matrix A1. The control unit 60 sets an array Col_sum[i] to SUM as the sum of the elements of the $i^{th}$ column at operation 804. The control unit 60 increments i by 1 (i=i+1) for the next column at operation 805 and returns the procedure to operation 802 to repeat the process to operation 805.

If the counter value i is determined to be greater than the information symbol sequence k at operation 802, the procedure goes to operation 806. At operation 806, the control unit 60 sets a Sum_max to a largest value among the per-column sums of the matrix A1. The control unit 60 sets a variable S to the sequence number of the column having the largest sum, that is, the column having a maximum value of Col_sum[i].

The control unit 60 initializes COUNT to 0, that is COUNT=0, at operation 807.

The control unit 60 determines whether COUNT is less than the number of elements, which may be referred to as NumberOfElements, of a column at operation 808, and, if COUNT is not less than the NumberOfElements, ends operation 800. If COUNT is less than the number of elements of column S, and thus is less than NumberOfElements, the procedure goes to operation 809. At operation 809, the control unit 60 changes the component corresponding to the column S, that is $x_S$, in the set $x_j$ for the component corresponding to the value of COUNT in the set K.

The control unit 60 initializes the counter i to 1, that is i=1, at operation 810 and then performs the procedure of FIG. 5B.

Referring to FIG. 5B, the control unit 60 determines whether i, which is initialized to 1, is equal to or less than p, which is the parity symbol, at operation 811. If i is equal to or less than p, the control unit 60 sets a new set call New_Col, and the control unit 60 forms the set with the values of $$\frac{1}{K_{count} + y[i]}$$

elements through operations 812 and 813.

The control unit 60 increments i by 1, that is i=i+1, at operation 814 and returns the procedure to operation 811.

If i initialized to 1 is greater than the parity symbol sequence p at operation 811, the control unit 60 sets a variable New_Sum to the sum of the elements of the set New_Col at operation 815. The control unit 60 compares the sum of the elements of the set, that is New_Sum, with the largest one of the per-column sums, that is Sum_max, at operation 816. If New_Sum is less than Sum_max, the control unit 60 changes the COUNT$^{th}$ component of the set K for $x_s$ corresponding to the column number S of the set $x_j$ at operation 817. If the Sum_max is equal to or less than New_sum, the procedure jumps to operation 820.

At operation 818, the control unit 60 replaces the New_Col as a set of the A1 with the column S having the largest sum among the per-column sums in the matrix A1. The control unit 60 initializes the flag FIND to true at operation 819. The control unit 60 increments COUNT by 1, that is COUNT=COUNT+1, at operation 820 and returns the procedure to operation 807 of FIG. 5A.

Figure 6B:
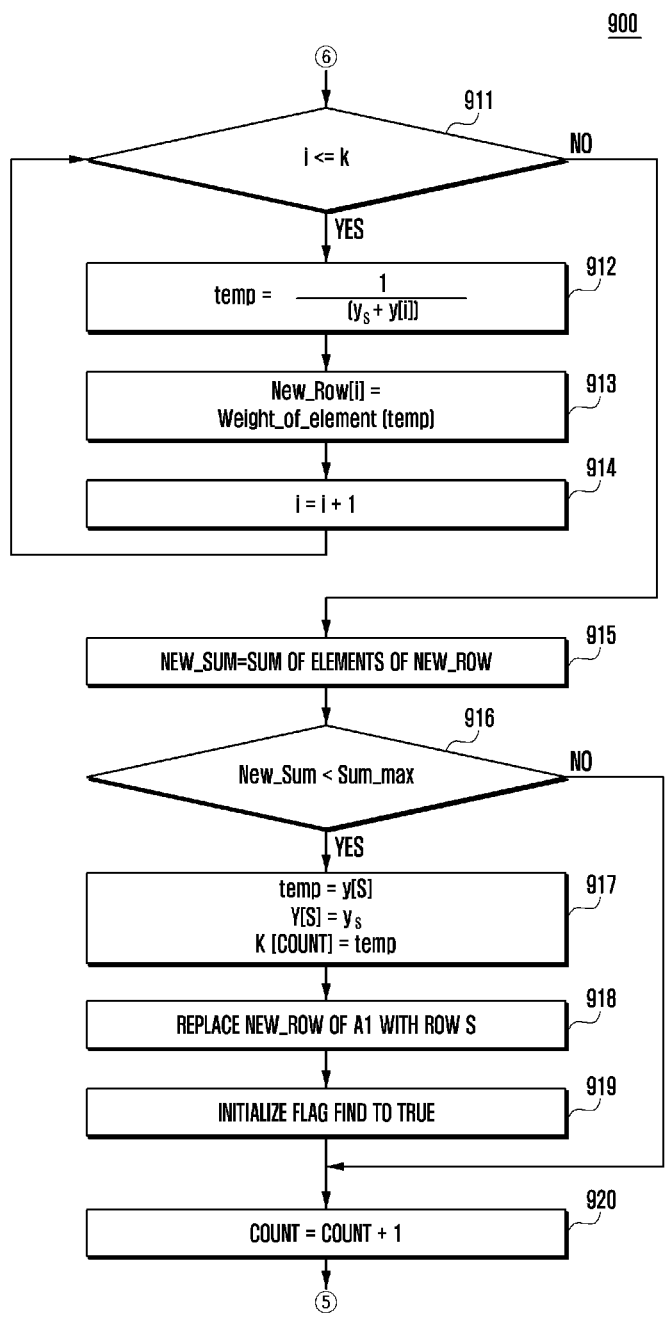

FIGS. 6A and 6B are flowcharts illustrating details of operation 900 of FIG. 3 according to an embodiment of the present disclosure.

Referring to FIG. 6A, the control unit 60 compares the largest value among the per-row sums of the matrix A1 with the sum of the elements of the set New_Col made up of values of $$\frac{1}{y_S + x[i]}$$

at operation 900 of FIG. 3, or in other words, updates the set $y_i$ through an XOR operation. Through this process, the control unit 60 generates the row S of the matrix.

The control unit 60 initializes the counter i indicating the $i^{th}$ row to 1, that is, i=1, at operation 901. The control unit 60 determines whether i is equal to or less than the parity symbol sequence p at operation 903 and, if so, the procedure goes to operation 903.

At operation 903, the control unit 60 calculates the sum of the elements of the $i^{th}$ row of the matrix A1 obtained at operation 600 of FIG. 3. The control unit 60 sets the Row_sum[i] to SUM as the sum of the elements of the $i^{th}$ row at operation 904. The control unit 60 increments i by 1, that is i=i+1, for the next column at operation 905 and returns the procedure to operation 902 to repeat the process to operation 905.

If the counter value i is greater than the parity symbol sequence p at operation 902, the procedure goes to operation 906. At operation 906, the control unit 60 sets the Sum_max to the largest value among the per-row sums of the matrix A1. The control unit 60 also sets a variable S to the sequence number of the row having the largest sum value.

The control unit 60 initializes COUNT to 0, that is COUNT=0, at operation 907.

The control unit 60 determines whether COUNT is less than the number of elements, or in other words, less than NumberOfElements, of the row S at operation 908 and, if not, ends operation 900. If COUNT is less than the NumberOfElements of the row S, the procedure goes to operation 909. At operation 909, the control unit 60 changes the component corresponding to the column S, that is $y_S$, in the set $y_i$ for the component corresponding to the value of COUNT in the set K.

The control unit 60 initializes the counter i to 1, that is i=1, at operation 910 and then performs the procedure of FIG. 6B.

Referring to FIG. 6B, the control unit 60 determines whether i, initialized to 1, is equal to or less than the information symbol sequence k at operation 911. If i is less than or equal to k, the control unit 60 configures a set called New_Row and forms the set with the values of $$\frac{1}{y_S + x[i]}$$

elements through operations 912 and 913.

The control unit 60 increments i by 1, that is i=i+1, at operation 914 and returns the procedure to operation 911.

If i initialized to 1 is greater than the information symbol sequence k at operation 911, the control unit 60 sets the variable New_Sum to the sum of the components of the set New_Row in operation 915. The control unit 60 determines whether the sum of the elements of the set, that is New_Sum, is less than the largest value of the per-row elements sums, that is Sum_max, at operation 916. If New_Sum is less than Sum_max, the control unit 60 changes the COUNT element of the set K to the value corresponding to the column S in the set $y_i$ at operation 917. On the other hand, if the New_Sum is equal to or greater than Sum_max in operation 916, the procedure jumps to operation 920.

The control unit 60 replaces the New_Row as a set of the matrix A1 with the row S having the largest value among the per-row elements sums in the matrix A1 at operation 918. The control unit 60 initializes the flag FIND to true at operation 919. The control unit 60 increments COUNT by 1, that is COUNT=COUNT+1, at operation 920 and returns the procedures to operation 907 of FIG. 6A.

As described above, the method of the present disclosure is capable of performing the packet encoding operation only with XOR operators for arithmetic of the matrix formed with Galois fields GF(2) through the entire procedure. The encoding can be performed through simple XOR operation with the pre-calculated generator matrix. Since the generator matrix is calculated in advance, the encoding can be performed with only the XOR operation.

This approach is more efficient in encoding/decoding data symbols as compared to the methods of the related art. The lost data recovery efficiency of the proposed algorithm is not inferior as compared to the codecs of the related art.

As described above, the data encoding method and apparatus of the present disclosure is advantageous in terms of improving data encoding speed by applying a Generator Cauchy matrix to the FEC module. Also, the data encoding method and apparatus of the present disclosure is advantageous in terms of improving the data transmission reliability in the high speed data communication environment.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of increasing encoding speed of an encoder of an electronic device in a high speed data communications network, the method comprising:
   receiving data entered through an input interface of the electronic device;
   processing the data into a data packet based on a Cauchy Reed-Solomon method to optimize a Generator Cauchy Matrix having minimal weight to increase the encoding speed of the encoder; and
   transmitting, over the high speed data communications network, the encoded data to a receiver to be decoded,
   wherein the Cauchy Reed-Solomon method to increase the encoding speed of the encoder comprises:
      acquiring sets $x_j$ (j=1 . . . k) $y_i$ (i=1 . . . p) in consideration of a rule of generating the Generator Cauchy Matrix, wherein k denotes a number of information symbols, and p denotes a number of parity symbols;
      generating a matrix A1 using the sets $x_j$ and $y_i$ wherein elements of the matrix A1 are obtained by $$\frac{1}{x_j + y_i}$$

and have weight of a Galois field, and wherein the matrix A1 has a size of P×K;
      generating a set K, wherein all elements of the set K are not included in the sets $x_j$ and $y_i$;
      updating the set $x_j$ by changing at least one element of the set $x_j$ for an element of the set K;
      updating the set $y_i$ by changing at least one element of the set $y_i$ for the element of the set K;
      generating the Generator Cauchy Matrix using the updated sets $x_j$ and $y_i$; and
      encoding the data including the information symbols and parity symbols using the Generator Cauchy Matrix.

2. The method of claim 1, wherein the updating of the set $x_j$ comprises:
   obtaining Sum_max as a largest value among per-column elements sums of the matrix A1;
   checking an element corresponding to a column sequence of the Sum_max in the set $x_j$;
   selecting $K_{count}$ as an element of the set K to be the element corresponding to the column sequence;
   generating a set New_Col made up of $$\frac{1}{K_{count} + y[i]}$$

as elements using the $K_{count}$;
   obtaining New_Sum as a sum of the elements of the set New_Col;
   replacing, when the Sum_max is greater than New_Sum, the element corresponding to the column sequence with the $K_{count}$; and
   changing the column corresponding to the Sum_max for the New_Col in the matrix A1.

3. The method of claim 1, wherein the updating of the set $y_i$ comprises:

obtaining Sum_max as a largest value among per-row elements sums;
checking an element corresponding to a row sequence of the Sum_max in the set $y_i$;
selecting $K_{count}$ as an element of the set K to be the element corresponding to the row sequence;
generating a set New_Row made up of $$\frac{1}{K_{count} + x[i]}$$

as elements using the $K_{count}$;
obtaining a New_Sum as a sum of the elements of the set New_Row;
replacing, when the SUM_max is greater than the New_Sum, the element corresponding to the row sequence with the $K_{count}$; and
changing the row corresponding to the Sum_max for the set New_Row in the matrix A1.

4. The method of claim 1, further comprising:
generating a square matrix A(n×n) before generating the matrix A1; and
generating a square matrix A'((p+k)×*(p+k)) before generating the matrix A1.

5. The method of claim 4, wherein the generating of the square matrix A(n×n) comprises forming the square matrix A with elements with $$\frac{1}{x_j + y_i}.$$

6. The method of claim 4, wherein the generating of the square matrix A' comprises:
obtaining sums of elements of respective rows of the square matrix A; and
deleting a row having a largest elements sum repeatedly until a number of rows of the square matrix A becomes (P+K).

7. The method of claim 4, wherein the generating the square matrix A' comprises:
obtaining sums of elements of respective columns of the square matrix A; and
deleting the column having a largest elements sum repeatedly until a number of columns of the square matrix A becomes (P+K).

8. An electronic device for increasing encoding speed in a high speed data communications network, comprising:
a display having an input interface for receiving data entered through the input interface;
a memory configured to store a Cauchy Reed-Solomon program for an optimization of a Generator Cauchy Matrix having a minimal weight;
an encoder for encoding the data;
at least one processor communicatively coupled to the encoder; and
a transceiver configured to transmit the encoded data to the receiver over the high speed data communications network,
wherein the encoder configured to:
receive the data entered through the input interface,
process the data into a data packet based on the optimization of the Generator Cauchy Matrix having the minimal weight to increase the encoding speed of the encoder, and wherein the at least one processor configured to execute a Cauchy Reed-Solomon program stored on the memory to optimize the Generator Cauchy Matrix to increase the encoding speed of the encoder by:
acquiring sets $x_j$ (j=1 . . . k) and $y_i$ (i=1 . . . p) in consideration of a rule of generating a Generator Cauchy Matrix, wherein k denotes a number of information symbols, and p denotes a number of parity symbols,
generating a matrix A1 using the sets $x_j$ and $y_i$ wherein elements of the matrix A1 are obtained by $$\frac{1}{x_j + y_i}$$

and have weight of a Galois field, and wherein the matrix A1 has a size of P×K,
generating a set K, wherein all elements of the set K are not included in the sets $x_j$ and $y_i$,
updating the set $x_j$ by changing at least one element of the set $x_j$ for an element of the set K,
updating the set $y_i$ by changing at least one element of the set $y_i$ for the element of the set K,
generating the Generator Cauchy Matrix using the updated sets $x_j$ and $y_i$, and
encoding the data including the information symbols and parity symbols using the Generator Cauchy Matrix.

9. The electronic device of claim 8, wherein the at least one processor, in order to update the set $x_j$, is further configured to:
obtain Sum_max as a largest value among per-column elements sums of the matrix A1,
check an element corresponding to a column sequence of the Sum_max in the set $x_j$,
select $K_{count}$ as an element of the set K to be the element corresponding to the column sequence,
generate a set New_Col made up of $$\frac{1}{K_{count} + y[i]}$$

as elements using the $K_{count}$,
obtain New_Sum as a sum of the elements of the set New_Col,
replace, when the Sum_max is greater than New_Sum, the element corresponding to the column sequence with the $K_{count}$, and
change the column corresponding to the Sum_max for the New_Col in the matrix A1.

10. The electronic device of claim 8, wherein the at least one processor, in order to update the set $y_i$, is further configured to:
obtain Sum_max as a largest value among per-row elements sums,
check an element corresponding to a row sequence of the Sum_max in the set $y_i$,
select $K_{count}$ as an element of the set K to be the element corresponding to the row sequence,
generate a set New_Row made up of $$\frac{1}{K_{count} + x[i]}$$

as elements using the $K_{count}$,
   obtain a New_Sum as a sum of the elements of the set New_Row,
   replace, when the SUM_max is greater than the New_Sum, the element corresponding to the row sequence with the $K_{count}$, and
   change the row corresponding to the Sum_max for the set New_Row in the matrix A1.

11. The electronic device of claim 8, wherein the at least one processor is further configured to:
   generate a square matrix A(n×n) before generating the matrix A1; and
   generate a square matrix A'((p+k)×(p+k)) before generating the matrix A1.

12. The electronic device of claim 11, wherein the at least one processor, in order to generate the square matrix A(n×n), is further configured to:
   obtain sums of elements of respective rows of the square matrix A, and
   delete the row having a largest elements sum repeatedly until a number of rows of the square matrix A becomes (P+K).

13. The electronic device of claim 11, wherein the at least one processor, in order to generate the square matrix A', is further configured to:
   obtain sums of elements of respective columns of the square matrix A, and
   delete the column having a largest elements sum repeatedly until a number of columns of the square matrix A becomes (P+K).

14. The electronic device of claim 11, wherein the generating of the square matrix A(n×n) comprises forming the square matrix A with elements with $$\frac{1}{x_j + y_i}.$$

\* \* \* \* \*